United States Patent [19]

Wuu et al.

[11] Patent Number: 5,652,174
[45] Date of Patent: Jul. 29, 1997

[54] UNIFIED STACKED CONTACT PROCESS FOR STATIC RANDOM ACCESS MEMORY (SRAM) HAVING POLYSILICON LOAD RESISTORS

[75] Inventors: Shou-Gwo Wuu, Chu-Tong; Mong-Song Liang, Hsin-Chu; Chung-Hui Su, Hsin-Chu; Chen-Jong Wang, Hsin-Chu, all of Taiwan

[73] Assignee: Taiwan Semiconductor Manufacturing Company Ltd., Hsin-Chu, Taiwan

[21] Appl. No.: 650,696

[22] Filed: May 20, 1996

[51] Int. Cl.[6] .................................................. H01L 21/8244
[52] U.S. Cl. .................................. 437/60; 437/48; 437/918
[58] Field of Search .............................. 437/47, 48, 49, 437/60, 918; 148/DIG. 136

[56]         References Cited

U.S. PATENT DOCUMENTS

| 4,904,620 | 2/1990 | Schmitz | 437/200 |
| 4,968,645 | 11/1990 | Baldi et al. | 437/918 |
| 4,980,732 | 12/1990 | Okazawa | 357/23.5 |
| 5,168,076 | 12/1992 | Godinho et al. | 437/60 |
| 5,200,356 | 4/1993 | Tanaka | 437/60 |
| 5,474,948 | 12/1995 | Yamazaki | 437/918 |

*Primary Examiner*—Chandra Chaudhari
*Attorney, Agent, or Firm*—George O. Saile

[57]            ABSTRACT

A method is provide for a unified stacked contact structure which concurrently forms all the polysilicon interconnects and the polysilicon load resistors on a SRAM device. FETs formed from a first polysilicon layer are coated with a first insulating layer. A second polysilicon layer is deposited and patterned forming portions of the SRAM circuit and concurrently forming openings over FET source/drain areas. A second insulating layer is deposited, and contact openings are selectively etched in the insulating layer over the openings in the second polysilicon layer. The exposed second polysilicon layer in the contacts serve as an etch mask for etching the first insulating layer to the source/drain contact areas, thereby forming contacts self-aligned to the openings in the second polysilicon layer. The contact openings in the node contact areas also expose portions of the gate electrodes .of the SRAM driver transistors. The unified stacked contacts are completed by depositing and patterning a conformal third polysilicon layer that forms interconnections in the contact openings between the exposed patterned polysilicon layers, and the third polysilicon layer is also patterned to form the polysilicon load resistors. The number of masking and other process steps are substantially reduced.

20 Claims, 3 Drawing Sheets

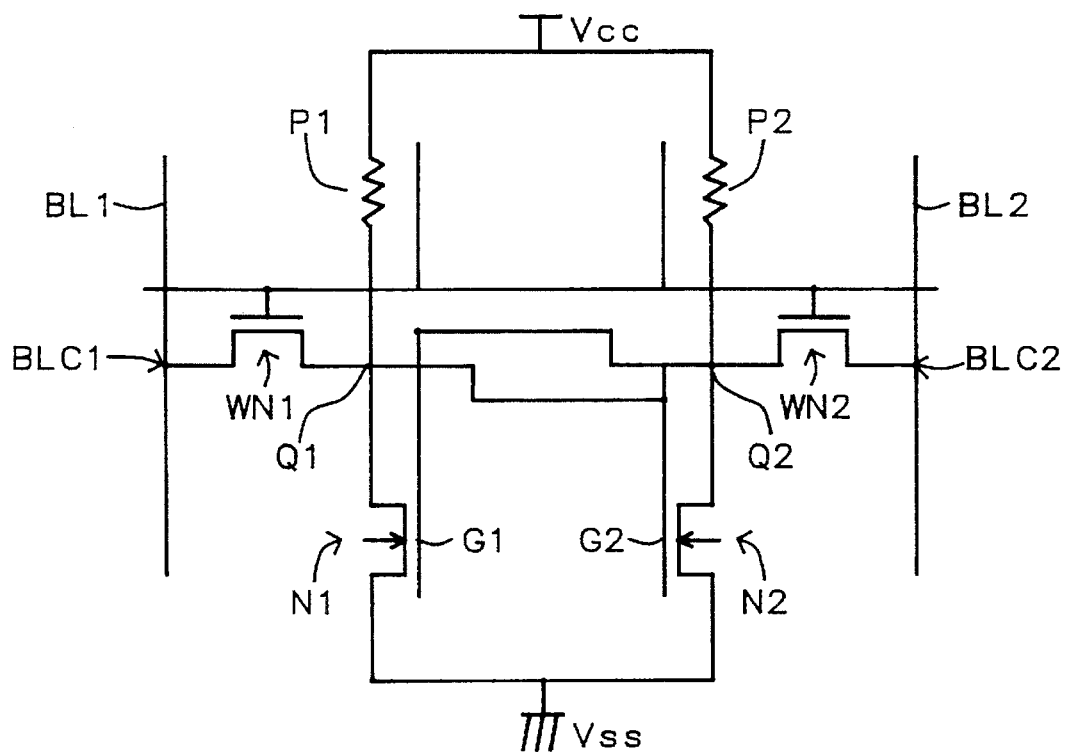
FIG. 1 – Prior Art
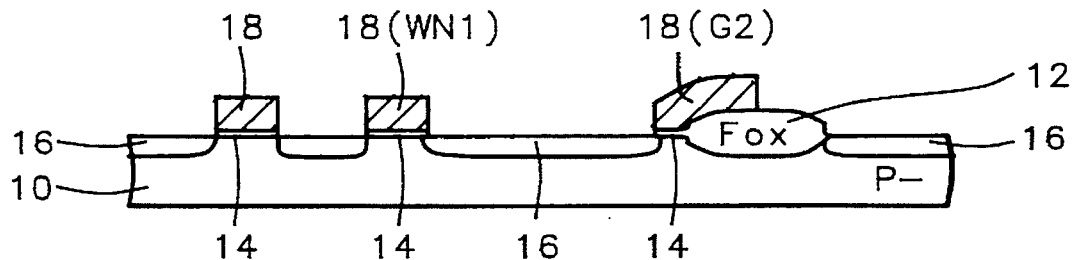
FIG. 2
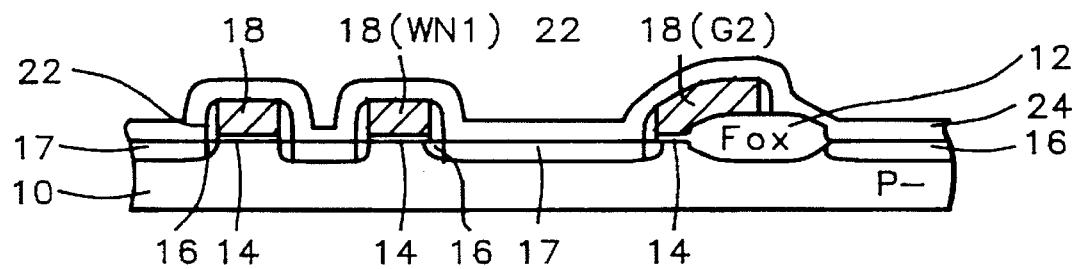
FIG. 3

5,652,174

UNIFIED STACKED CONTACT PROCESS FOR STATIC RANDOM ACCESS MEMORY (SRAM) HAVING POLYSILICON LOAD RESISTORS

BACKGROUND OF THE INVENTION (1) Field of the Invention

The present invention relates to integrated circuits on semiconductor substrates, and more particularly to a simplified process for fabricating unified stacked contacts on static random access memory (SRAM) cells having polysilicon load resistor.

(2) Description of the Prior Art

Dynamic Random Access Memory (DRAM) and Static Random Access Memory (SRAM) circuits are used extensively in the electronics industry for storing data in digital systems, such as computers. The SRAM is much faster than the DRAM circuit, but is more costly to manufacture. However, because of its speed the SRAM is ideal for use as a cache or buffer memory to speed up the system performance, and is therefore preferred over the DRAM device. Each of the memory cells on a SRAM device is usually composed of six transistors and functions as a static latch or flip flop circuit, and does not require a refreshed cycle like a DRAM cell. Unfortunately, the SRAM devices require more processing steps than the DRAM and is therefore less cost effective to manufacture. Typically, the two load transistors in a six-transistor CMOS SRAM cell are composed of P-channel thin film field effect transistor (TFT) that require additional processing steps. One alternative SRAM device manufactured in the semiconductor industry is one in which the thin film transistor (TFT) are replaced by polysilicon load resistors. This simplifies the processing by avoiding the need to fabricate a TFT, but is still less cost effective to make than the DRAM cell, and there is still a strong need in the industry to simplify the process.

Another concern with the conventional TFT SRAM cell is the non-ohmic stacked contacts that are formed in the contact openings, and occur at interfaces between polysilicon layers having different types of conductive dopants ($P^+/N^+$). The polysilicon load resistor SRAM cells avoid the unwanted occurrence of these $P^+/N^+$ junctions.

A circuit schematic for a typical polysilicon load resistor SRAM cell, commonly referred to as poly-load SRAM, is shown in FIG. 1. Only one of the cells in the array of cells is shown in FIG. 1. The SRAM circuit is fabricated using polysilicon resistors that are doped with an N-type conductive dopant for the load resistors, labeled P1 and P2 in FIG. 1. Two N-channel FETs formed in and on the substrate are used for the driver transistors, labeled N1 and N2, and two N-channel FETs, formed at the same time, are also used as the pass transistors, and labeled WN1 and WN2 in FIG. 1.

Briefly, the SRAM circuit functions as follows. Address row and column decoder circuits on the periphery of the SRAM chip (not shown) select a memory cell. Referring to FIG. 1, the applied gate voltage on the word line WL switch on the pass transistors WN1 and WN2. The voltage at the nodes Q1 and Q2 between the load resistor P1 and drive transistor N1 and between P2, N2, respectively are sensed on the bit lines BL1 and BL2 during the read cycle to determine the state of the SRAM latch. During the write cycle when the write circuit (not shown) is enabled an impressed voltage on the bit lines can switch the voltage levels on the latch and thereby can switch the state of the cell that stored the binary data representing the one's and zero's.

Typically, during the fabrication of the SRAM circuit on a semiconductor substrate several layers of patterned conductivity doped amorphous or polysilicon films are used to form parts of the N-channel transistors, the polysilicon resistors and the intralevel connections. The polysilicon layers are separated and electrically insulated from each other by dielectric layers, such as silicon oxide. These various electrically conducting polysilicon layers and portions of the substrate are then interconnected by forming contact openings in the insulating layers between the various polysilicon layers, such as by photoresist masking and etching. Typically, the conventional SRAM cell requires a large number of masking and etching steps that include the patterning of about three polysilicon layers and about three masking and etching steps to form the contact openings between the polysilicon layers and to the substrate. It is also necessary, in the conventional process, to deposit the first polysilicon layer in two steps (split polysilicon deposition) to form the pass and driver transistors, thereby further increasing the number of process steps. Therefore, there is a very strong need in the semiconductor industry to reduce the number of processing steps.

One methods have been described by T. Okazawa, U.S. Pat. No. 4,980,732, for improving the SRAM-Thin Film Transistor (TFT) and for forming metal plug contacts to the substrate. Okazawa addresses a method for making TFTs with lower off currents by off setting the drain side of the FET channel and in the prior art of the same patent there is described the use of aluminium to form an ohmic contact between the P doped drain of the P-channel TFT and source of the N-channel FET formed on the substrate. However, the method dose not address the fabrication of poly-load SRAM nor methods of reducing the number of processing steps.

Therefore, there is still a strong need in the semiconductor industry for methods that reduce the number of masking levels and number of processing steps, and thereby improve the SRAM structure and provide a more cost effective SRAM process.

SUMMARY OF THE INVENTION

It is a principle object of the present invention to provide a unified stacked method for fabricating an array of SRAM cells having substantially fewer photoresist masking steps and fewer processing steps than for a conventional polysilicon load resistor SRAM process, and thereby improve process yield and reduce the manufacturing cost.

It is another object of this invention to use a single contact opening step and the patterning of the polysilicon load resistor layer to concurrently form all the low resistance ohmic contacts between the doped polysilicon layers and to the substrate contacts using this unified stacked contact structure.

It is still another objective of this invention to eliminate the need for a split polysilicon deposition for forming the field effect pass transistor and driver transistor on the SRAM cell, and thereby further reducing the processing steps.

It is still another objective of this invention to eliminate the cap oxide on the FET gate electrodes, and thereby provide a less rough surface topography for improved high resolution (shallow focal length) lithographies.

The method of formation an array of static random access memory (SRAM) cells having the unified stacked contact structure, in accordance with the objects of this invention, begins by providing a $P^-$ (boron) doped single crystal semiconductor substrate having device areas on the substrate surface that are electrically isolated from each other by Field OXide (FOX) areas. A thin FET gate oxide is then formed on the device areas. An $N^+$ doped first polysilicon layer is deposited and patterned, such as by photoresist masking and plasma etching, to form the N-channel FET gate electrodes for the pass transistors and for the driver transistors of the SRAM circuit. However, unlike the conventional SRAM process, a cap oxide that is typically formed on the gate electrodes to provide for etching self-aligned contacts is not required by the method of this invention, thereby further reducing the rough topography on the substrate surface. The first polysilicon layer also forms the intraconnecting word lines for the pass transistors. Lightly doped N⁻ source/drain (LDD) areas are then formed in the device areas adjacent to the gate electrodes by ion implantation. A conformal sidewall insulating layer is deposited and anisotropically etched back to the top surface of the patterned first polysilicon layer to form polysilicon sidewall spacers on the sidewalls of the gate electrodes. N⁺ doped source/drain contact areas are formed next adjacent to the sidewall spacers by ion implantation of an N-type dopant, such as arsenic ($As^{75}$) or phosphorus ($P^{31}$) ions, thereby completing the N-channel FETs.

The unified stacked contact structure and the polysilicon load resistors are formed next. The process continues by depositing a blanket first insulating layer composed of, for example, silicon oxide on the N-channel FETs and elsewhere on the substrate. Important in this invention, and unlike the conventional SRAM process, contact openings are not etched in the first insulating layer at this time. Instead, a second polysilicon layer, also doped N⁺, is deposited on the first insulating layer. The second polysilicon layer is patterned to form an interconnecting layer, and important in this invention, the second polysilicon layer is also patterned, by the same masking and etching, to have openings that lie within and are aligned to the FET source/drain contact areas that are used as the bit line contacts and also the ground plane contacts for the SRAM drive transistors. The second polysilicon layer is also patterned leaving larger openings over the source/drain contact areas that are designed to be the node contacts. A second insulating layer is then deposited on the patterned second polysilicon layer and elsewhere on the exposed first insulating layer.

Now, important to this invention, a patterned photoresist etch mask is formed on the second insulating layer having contact openings that are larger in width (diameter) and are aligned over openings in the second polysilicon layer. Contact openings are then anisotropically and selectively etched in the second insulating layer to the first polysilicon layer, and thereafter the first insulating layer exposed in the second polysilicon openings is anisotropically etched to the source/drain contact areas. The contact openings in the first insulating layer being self-aligned to the openings in the polysilicon layer which serves as an etch mask. During the formation of the SRAM bit line and ground plane contact openings by the above method, the node contact openings are also concurrently formed to the source/drain contact areas of the pass transistor areas using the same photoresist masking and etching step. The node contacts are etch in the second and first insulating layer to the source/drain contact areas as defined by the SRAM mask design. The node contact openings also extends over and expose a portion of the patterned first polysilicon layer that form the gate electrodes for the SRAM driver transistors are by designed adjacent to the source/drain contact areas of the pass transistor.

The unified stacked contacts and the SRAM polysilicon load resistors are now completed by depositing and patterning a third polysilicon layer conductively doped with an N-type dopant. Isolated portions of the third polysilicon layer over the bit line contact openings form an electrical interconnect between the bit line contact to the pass transistor source/drain contact areas and the bit line metallurgy formed from the patterned second polysilicon layer. The electrical interconnect for the SRAM node contacts are formed concurrently from patterned portions of the third polysilicon layer that lie over and interconnect the node source/drain contact area of the pass transistor and the gate electrode of the SRAM driver transistor. The is third polysilicon layer is also patterned to form the polysilicon load resistor formed which is contiguous with node contact. The unified stacked contact structure is now electrically insulated using a third insulating layer, composed for example of a borophosphosilicate glass (BPSG), and the SRAM device (circuit) is completed by including addition contact openings and addition metal interconnect levels, which are conventional and not discussed in detail.

The use of this unified stacked contact structure or module, by the method of this invention, on a SRAM device having polysilicon load resistor eliminates the need for a split polysilicon deposition at the first polysilicon layer and the contact opening used to electrically interconnect the SRAM driver transistor to the node contact. The formation of the contact openings by a single masking and etching step, by this invention, utilizing the openings in the second polysilicon layer formed concurrently with the required patterning of the second polysilicon layer also eliminates the need for forming separate self-aligned contact openings, and further eliminate the need for the cap oxide on the gate electrodes of the field effect transistors that are commonly used on more conventional SRAM structures.

BRIEF DESCRIPTION OF THE DRAWINGS

The objects and other advantages of the invention will become more apparent in the preferred embodiment when read in conjunction with the following drawings, wherein:

FIG. 1 is a electrical schematic of a conventional prior art circuit of a four transistor/load resistor SRAM cell.

FIGS. 2 through 6 are schematic cross sectional views for the process sequence for building an improved SRAM cell having the unified stacked contact structure. Only a portion of the cell is shown in the Figs. depicting the formation of one of the node contacts and bit line contacts.

DESCRIPTION OF THE PREFERRED EMBODIMENTS

Figure 4:
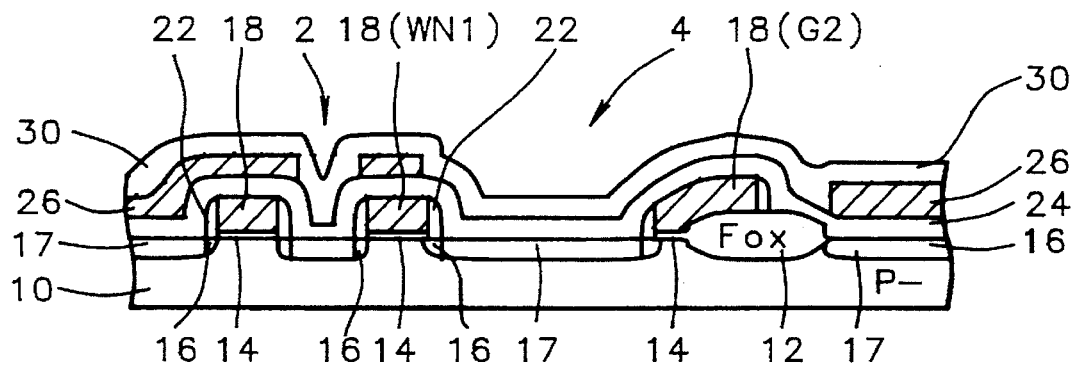

The present invention describes an improved method for fabricating arrays of static random access memory (SRAM) cells in which the interconnections of the discrete circuit elements are formed using a novel unified stacked contact structure. The method reduces the number of masking steps and etching steps which is not achieved by the convention stacked contact of the prior art. Although the present invention describes a method for making an improved SRAM circuit, it should be well understood by those skilled in the art that the unified stacked contact technology can be equally applied to other semiconductor integrated circuits where reduction in processing steps is desired.

Referring now to FIGS. 2 through 6, the method is described for forming the unified stacked contact structure during the fabrication of a SRAM device. As shown in FIG.

2, the SRAM process begins by forming Field OXide (FOX) areas 12 that electrically isolate device areas on a semiconductor substrate 10. The substrate 10 is typically composed of a P doped single crystal silicon on which the SRAM cells are to be built. For practical reasons only a portion of the SRAM memory cell is shown in FIG. 2. Typically, the field oxide 12 is formed by selective oxidation of the regions around the device areas, also only partially shown in the Figs. For example, the conventional LOCal Oxidation of Silicon (LOCOS) process can be used, and the oxide is usually grown to a thickness of between about 4000 to 6000 Angstroms.

After forming the field oxide 12, the surface of the device areas are thermally oxidized to form a gate oxide 14. The gate oxide is preferably grown to a thickness of between about 60 to 200 Angstroms. A blanket first polysilicon layer 18 is then deposited by low pressure chemical vapor deposition (LPCVD) using for example silane ($SiH_4$) as the reactant gas. Layer 18 is typically doped with an N-type impurities, for example, by ion implantation or alternatively by in situ doping with arsenic (As) or phosphorus (P). The dopant concentration in layer 18 is between about 1.0 E 18 to 1.0 E 21 atoms/cm$^3$, and the thickness of layer 18 is between about 1000 to 3500 Angstroms. The first polysilicon layer 18 is then patterned using conventional photolithographic techniques and anisotropic plasma etching to form the gate electrodes 18 for the N-channel FET, as shown in FIG. 2. The N-channel FETs are used as the pass transistors, such as WN1, and as the driver transistors, such as N1 for the latch portion of the SRAM circuit, as depicted in the circuit schematic of FIG. 1. The gate electrode for the pass transistors WN1 is similarly labeled in the schematic cross sections of FIG. 2, and a portion of the gate electrode G2 for driver transistor N2 that extends over the field oxide and partially over the source/drain area of the pass transistor WN1 is also similarly labeled G2 in FIG. 2. Unlike the conventional SRAM process, the first polysilicon layer 18 is not deposited in two steps (split poly deposition) and the contact opening formed in the gate oxide during the split poly deposition to electrically connect the driver transistor gate electrode to the pass transistor node contact is not necessary, thereby reducing the number of process steps. Also, the cap oxide that is usually formed on the gate electrodes to facilitate forming the self-aligning source/drain contacts in the conventional process is also not required, thereby further reducing the process complexity.

After forming the gate electrodes, N$^-$ lightly doped drains (LDD) 16 are formed in the substrate 10 adjacent to the gate electrodes 18, for example by implanting phosphorus ion ($P^{31}$) at a dose of between about 1.0 E 13 to 1.0 E 15 ions/cm$^2$ and at an implant energy of between about 25 to 40 KeV. The patterned polysilicon layer 18 also serves as the interconnecting word lines for the pass transistors WN1 and WN2, such as word line WL depicted in FIG. 1. The word lines, however, are not visible in the cross sections of FIG. 2.

Sidewall spacers 22 are formed next on the sidewalls of the gate electrodes 18, as shown in FIG. 3. The spacers 22 are formed by depositing a conformal sidewall insulating layer and anisotropically etching back the layer to the surface of the gate electrodes (which is also etched back to the substrate surface), thereby forming the spacers 22 on the sidewalls of the gate electrodes, as shown in FIG. 3. The sidewall insulating layer is typically composed of a silicon oxide ($SiO_2$), and deposited by low pressure chemical vapor deposition (LPCVD) using, for example, a reactant gas, such as tetraethosiloxane (TEOS), and the thickness of the sidewall insulating layer 22 prior to etch back is between about 1000 to 2500 Angstroms. The N-channel FETs are now completed by forming the N$^+$ doped source/drain contact areas 17 usually by ion implantation of an N type dopant, such as arsenic ($As^{75}$) or phosphorus ($P^{31}$), as is also depicted in FIG. 3.

Continuing with the process, as shown in FIG. 3, a first insulating layer 24 is deposited on the completed N-channel FETs and elsewhere on the exposed source/drain contact areas 17. The layer 24 is preferably a silicon oxide deposited at a medium temperature range (650° to 800° C.) using, for example, LPCVD and a TEOS gas. The preferred thickness of layer 24 is between about 700 to 2000 Angstroms. Unlike the process for the conventional prior art, in the present invention the contact openings to the source/drain areas are not etched at this time, and therefore a second masking and etch step is further eliminated.

Figure 5:
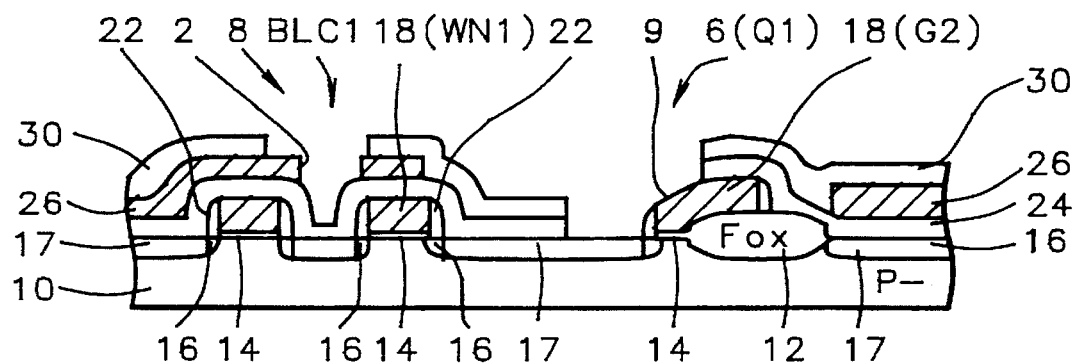
Figure 6:
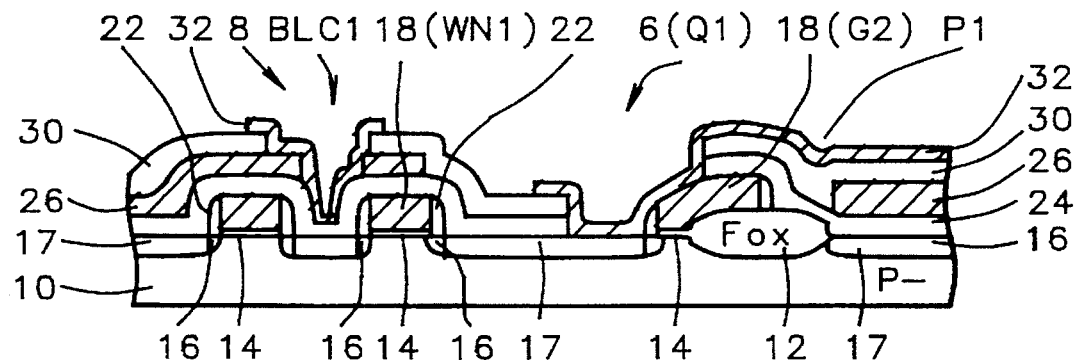

Referring now to the remaining FIGS. 4 and 6 the method for forming interconnecting unified stacked contact structure for the SRAM having polysilicon load resistor is now described. Although, for practical reasons, only one of the unified contacts formed at node contact Q1, as depicted in FIG. 1, is described, it should be clearly understood that the other node contact Q2 is likewise formed and indeed all the node contacts for the array of SRAM cells is formed in like manner during the same processing steps. Also shown in FIGS. 4-6, and also formed concurrently is the bit line contact, labeled BLC1, as is also depicted in FIG. 1.

Continuing now with the process, as shown in FIG. 4, a second polysilicon layer 26 is blanket deposited on the first insulating layer 24, and patterned. The layer 26 is preferably deposited by low pressure CVD (LPCVD) using, for example silane ($SiH_4$), and is similar to the deposition method for the first polysilicon layer 18. Layer 26 is also doped N$^+$ with phosphorus ($P^{31}$) by ion implantation and having a dopant concentration in the range of between about 1.0 E 18 to 1.0 E 21 atoms/cm$^3$. The thickness of the polysilicon layer 26 is preferably in the range of between about 700 to 3000 Angstroms. The second polysilicon layer 26 is then patterned by conventional photolithographic techniques and anisotropic plasma etching to provide the electrically conducting patterns that will later form portions of the SRAM circuit. An important feature of the invention is the formation of an opening 2 ( FIG. 4) in a portion of the layer 26, during the patterning that is aligned over and within the source/drain contact areas 17 of the N-FET WN1 that is later to be used for the bit line contact BLC1 (FIG. 1) for the SRAM cell. The second polysilicon layer is also patterned to provide a larger open area 4 over the second source/drain area 17 of N-FET WN1 where the node contact Q1 is later formed. As also shown in FIG. 4, the open area 4 in layer 26 is also made sufficiently large to exposes a portion of the first polysilicon layer 18 which is used to form the gate electrode (G2) of the SRAM driver transistor N2, as depicted in the circuit in FIG. 1.

Not depicted in the FIG. 4., but in like fashion, similar structures are formed from the polysilicon layer 26 for the second SRAM node Q2 in the cell, as depicted in FIG. 1, wherein the gate electrode G1 also formed from the first polysilicon 18 is similarly aligned to the node contact Q2, and each cell area in the array of cells is similarly formed.

As will soon become clear, the patterned polysilicon layers 26 serve a double purpose. The patterned polysilicon layer 26 provide for some of the building elements of the semiconductor devices while the openings, such as opening 2 in FIG. 4 also serve as a self-aligning etch stop mask for forming the various stacked contact openings and interconnects that are require for the SRAM circuit.

Referring still to FIG. 4, a conformal second insulating layer 30 is deposited on the patterned second polysilicon layer 26 and elsewhere on the first insulating layer 24. The insulating Layer 30 is preferably composed of silicon oxide ($SiO_2$) and is also deposited, for example, by low pressure CVD using a TEOS gas, similar to the method used for depositing the first insulating layer 24. The thickness of layer 30 is preferably between about 700 to 2000 Angstroms.

Referring new to FIG. 5, conventional photolithographic techniques and selective-anisotropic plasma etching are used to form, concurrently, all the contact openings that are required to interconnect the various polysilicon layers and the source/drain contacts on the substrate. More specifically, as shown in FIG. 5, the node contact 6 (Q1 in FIG. 1) is formed by etching the contact opening 6 so that it extends over a portion of the patterned first polysilicon layer 18 (G1) that serves as the gate electrode for the driver transistor (N2 in FIG. 1). The node contact opening 6 is etched in the insulating layers 30 and 26 to the polysilicon layers 18 exposing the surface 9 on layer 18 and further exposing the source/drain contact area 17 to form the node contact 6 (Q1 in FIG. 1). In like fashion, and at the same time, the contact opening 8 (BLC1 in FIG. 1) is etched to the second source/drain contact area 17 forming the bit line contact opening for the pass transistor WN1. The contact opening 8 is designed larger than the opening 2 in the second polysilicon layer 26 (see FIG. 4), so that the final etched opening is self-aligned to the opening 2 in the polysilicon layer 26, as shown in FIG. 5. The anisotropic—selective etching is accomplished in a reactive ion etcher using an etch gas mixture that has a high etch rate selectivity of silicon oxide to silicon. For example, the etching can be accomplished in a carbon tetrafluoride ($CF_4$) containing a hydrogen gas ($H_2$) or alternatively in a gas mixture containing trifluoromethane ($CHF_3$). The preferred etch rate ratio of silicon oxide to silicon being greater than about 30 to 1. The etched contacts are depicted in FIG. 5 after the photoresist is removed.

Referring to FIG. 6, the unified stacked contact structure is now completed and the load resistors are formed by depositing and patterning a conductive N-type doped third polysilicon layer 32 which conformally fills the openings 6 (Q1) and 8 (BLC1) and thereby forms the electrical interconnections between the various circuit elements. Conventional photolithographic techniques and anisotropic plasma etching is used to pattern the third polysilicon layer 32. The patterning also forms the poly-load resistors (P1 and P2 in FIG. 1). For example, in the Q1 node contact 6, the N-doped polysilicon layer 32 interconnects the gate electrode (G2) of the second driver transistor N2 and the node contact Q1 of the pass transistor WN1, as required by circuit for the SRAM cell in FIG. 1. The polysilicon layer 32 is also appropriately doped with an N-type impurity, such as phosphorus (P), and patterned to form the load resistors P1 and P2, resistor P1 being contiguous with the node contact Q1, as required by the circuit in FIG. 1. The dopant concentration of layer 32 is preferably between about $1.0 \text{ E } 18$ to $1.0 \text{ E } 21$ atoms/$cm^3$. The thickness of layer 32 is between about 400 to 1000 Angstroms. Layer 32 is selectively doped in the load resistor areas using a photoresist block out mask and an ion implantation. The preferred implant ion is arsenic ($As^{75}$) having an implant dose of between about $1.0 \text{ E } 13$ to $1.0 \text{ E } 14$ ions/$cm^2$ and an ion implant energy of between about 30 to 45 KeV.

The bit line contact BLC1 in FIG. 1 and similarly labeled in FIGS. 5 and 6 is also achieved by forming an interconnect from layer 32 between the bit line metallurgy patterned from the second polysilicon layer 26 and the source/drain contact area 17 of pass transistor WN1. The array of SRAM cells with the unified stacked contacts is now electrically insulated by depositing a third insulating layer 34, as shown in FIG. 6. The insulating layer 34 is preferably composed of borophosphosilicate glass (BPSG), and is deposited to a thickness of between about 7000 to 11000 Angstroms, and is further annealed to form an essentially planar surface. Conventional means are then used to form contact openings in layer 34 and the upper levels of metallurgy to complete the SRAM device.

Figure 7:
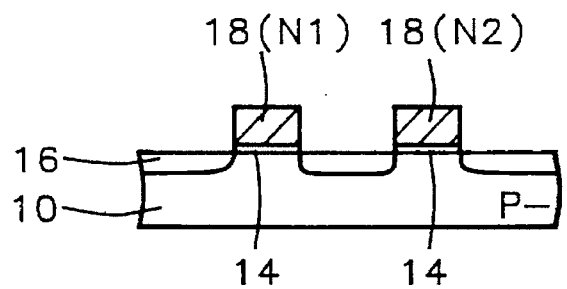
FIGS. 7 through 10 are schematic cross sectional views for the formation of one of the ground plane contacts that is concurrently formed during the formation of the node and bit line contacts depicted in FIGS. 2 through 6.
Figure 8:
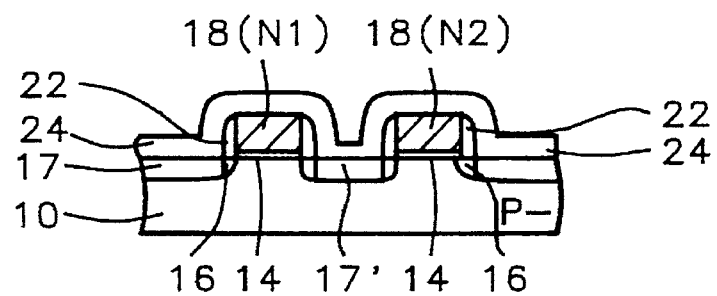
Figure 9:
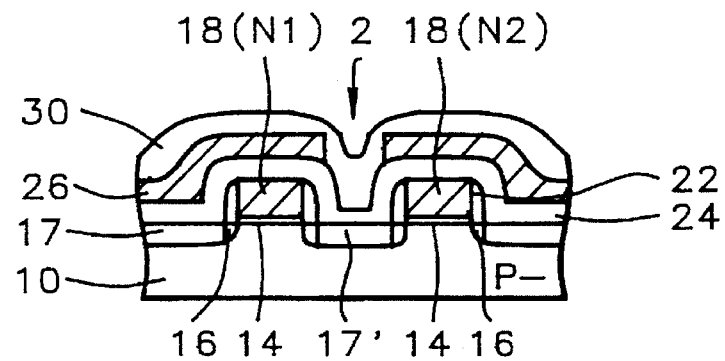
Figure 10:
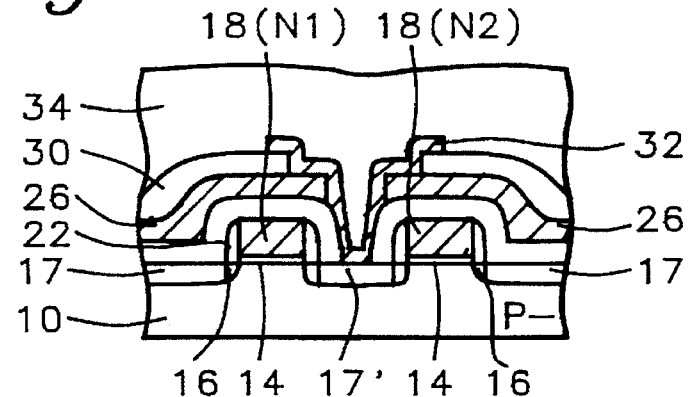

FIGS. 7 through 10 show the formation of unified stacked contact structure for the interconnection of the ground plate (depicted by Vss in FIG. 1) to the common source/drain areas of the two driver transistors in the SRAM cell, labeled N1 and N2 in FIG. 1 that are concurrently formed with the bit line and node contact interconnects. Therefore, only a brief description of the drawing in FIGS. 7–10 is given. FIG. 7 shows the formation of the gate electrodes (G1 and G2 in FIG. 1) for the driver transistors (N1 and N2 in FIG. 1) from the first polysilicon layer 18 that are formed at the same time the pass transistors WN1 and WN2 are formed on the substrate 10 having a gate oxide 14. The lightly doped source/drains 16, the sidewall spacers 22, and the source/drain contact areas 17 are also formed next, as shown in FIG. 8. The first insulating layer 24 is deposited as also shown in FIG. 8, and then the second polysilicon layer 26 is deposited, as shown in FIG. 9, and patterned to form the ground plate having an opening 2 (formed at the same time the opening 2 is formed over the bit line contact area, see FIG. 8) over the common source/drain contact area 17' of the driver transistors N1 and N2. The second insulating layer 30 is deposited, as shown in FIG. 9, and the contact opening 8 is formed in layer 30 aligned over and larger in width than the opening 2 in the polysilicon layer 26, an as for the bit line contact the first insulating layer 24 in the polysilicon opening 2 is selectively etched to the common source/drain area 17'. The unified stacked contact for the ground plate is now completed, as shown in FIG. 10, by depositing and patterning the third polysilicon layer 32 to interconnect the ground plate formed from the second polysilicon layer 26 to the common source/drain contact areas 17.

While the invention has been particularly shown and described with reference to the preferred embodiments thereof, it will be understood by those skilled in the art that various changes in form and details may be made without departing from the spirit and scope of the invention.

What is claimed is:

1. A method for making unified stacked contact on static random access memory (SRAM) devices having polysilicon load resistors, comprising the steps of;

providing a semiconductor substrate having field effect transistors (FETs) formed on and in said substrate surface, said FETs having gate electrodes formed from a first polysilicon layer, and further having insulating sidewall spacers on said FET gate electrodes and source/drain contact areas adjacent to said gate electrodes on said substrate surface;

depositing a conformal first insulating layer over said FETs and elsewhere on said substrate;

depositing a conformal second polysilicon layer on said first insulating layer;

patterning said second polysilicon layer using photoresist masking and plasma etching forming, as part of said patterned second polysilicon layer, openings over and aligned to said FET source/drain contact areas;

depositing a conformal second insulating layer on said patterned second polysilicon layer and elsewhere on said first insulating layer;

anisotropically and selectively etching contact openings in said second insulating layers using a photoresist mask, said selective etching stopping at portions of said second polysilicon layer, and furthermore said exposed portions of said second polysilicon layers in said contact opening providing a masking effect in said contact openings for subsequent etching of said underlying first insulating layers to said source/drain contacts forming bit line and ground plane contact for said SRAM device; and concurrently and by said same anisotropic and selective etching forming node contact openings in said second and first insulating layers to portions of said patterned first polysilicon layer that form the gate electrodes of SRAM drive transistors, and said same node contact openings also formed to said adjacent source/drain areas of said SRAM pass transistors;

removing said photoresist mask; and depositing a conformal third polysilicon layer over said second insulating layer and in said bit line and node contact openings;

patterning said third polysilicon layer by photoresist masking and anisotropic plasma etching, thereby forming electrical interconnects in said bit line contact openings between portions of said second polysilicon layer and said source/drain contacts, and concurrently forming in said node contact openings electrical interconnections between said SRAM drive transistor gate electrodes and said pass transistor source/drain contact areas, further said patterned third polysilicon layer forming polysilicon load resistors for said SRAM devices;

depositing a third insulating layer and electrically insulating said patterned third polysilicon and thereby completing said unified stacked contact structure.

2. The method of claim 1, wherein the thickness of said first polysilicon layer is between about 1000 to 3500 Angstroms.

3. The method of claim 1, wherein the thickness of said first insulating layer is between about 700 to 2000 Angstroms.

4. The method of claim 1, wherein the thickness of said second polysilicon layer is between about 700 to 3000 Angstroms.

5. The method of claim 1, wherein the thickness of said second insulating layer is between about 700 to 2000 Angstroms.

6. The method of claim 1, wherein said first and second polysilicon layers are doped with an N-type conductive dopant having a concentration between about 1.0 E 18 to 1.0 E 21 atoms/cm$^3$.

7. The method of claim 1, wherein, said third polysilicon layer is selectively doped by photoresist masking and ion implantation to form said SRAM load transistors and electrical interconnections.

8. The method of claim 1, wherein the thickness of said third polysilicon layer is between about 400 to 1000 Angstroms.

9. The method of claim 1, wherein said openings in said second polysilicon layers provide a self-aligning etch stop mask for forming contact opening in the underlying said insulating layer to said SRAM device source/drain contact areas.

10. The method of claim 1, wherein said anisotropic and selective etch of said contact openings is carried out in a plasma etcher having an etch rate ratio of silicon oxide to polysilicon greater than about 30.0 to 1.0.

11. A method for fabricating an array of static random access memory (SRAM) cells having field effect transistors (FETs) and polysilicon load resistors using a unified stacked contact structure, comprising the steps of:

providing a semiconductor substrate having device areas and field oxide areas;

forming a first gate oxide on said device areas;

depositing a blanket first polysilicon layer on said device areas and said field oxide areas;

patterning said first polysilicon layer and forming field effect transistor (FET) gate electrodes on said device areas and word lines elsewhere on said substrate, and concurrently forming gate electrodes for driver transistors in said SRAM cell areas;

depositing a blanket sidewall insulating layer on said gate electrodes;

Anisotropically etching back said sidewall insulating layer to said gate electrodes, and thereby forming insulating sidewall spacers on said gate electrodes;

implanting dopant atoms in said substrate adjacent to said gate electrodes, and thereby forming FET source/drain contact areas and completing said FETs, and furthermore;

depositing a conformal first insulating layer over said FETs and elsewhere on said substrate;

depositing a conformal second polysilicon layer on said first insulating layer;

patterning said second polysilicon layer using photoresist masking and plasma etching forming, as part of said patterned second polysilicon layer, openings over and aligned to said FET source/drain contact areas;

depositing a conformal second insulating layer on said patterned second polysilicon layer and elsewhere on said first insulating layer;

anisotropically and selectively etching contact openings in said second insulating layers using a photoresist mask, said selective etching stopping at portions of said second polysilicon layer, and furthermore said exposed portions of said second polysilicon layers in said contact opening providing a masking effect in said contact openings for subsequent etching of said underlying first insulating layers to said source/drain contacts forming bit line and ground plane contact for said SRAM device; and concurrently and by said same anisotropic and selective etching forming node contact openings to portions of said patterned first polysilicon layer that form the gate electrodes of SRAM drive transistors, and said same node contact openings also formed to said adjacent source/drain areas of said SRAM pass transistors;

removing said photoresist mask; and depositing a conformal third polysilicon layer over said second insulating layer and in said bit line and node contact openings;

patterning said third polysilicon layer by photoresist masking and anisotropic plasma etching, thereby forming electrical interconnects in said bit line contact openings between portions of said second polysilicon layer and said source/drain contacts, and concurrently forming in said node contact openings electrical interconnections between said SRAM drive transistor gate electrodes and said pass transistor source/drain contact areas, further said patterned third polysilicon layer forming polysilicon load resistors for said SRAM devices;

depositing a third insulating layer and electrically insulating said patterned third polysilicon and thereby completing said array of SRAM cells.

12. The method of claim 11, wherein the thickness of said first polysilicon layer is between about 1000 to 3500 Angstroms.

13. The method of claim 11, wherein the thickness of said first insulating layer is between about 700 to 2000 Angstroms.

14. The method of claim 11, wherein the thickness of said second polysilicon layer is between about 700 to 3000 Angstroms.

15. The method of claim 11, wherein the thickness of said second insulating layer is between about 700 to 2000 Angstroms.

16. The method of claim 11, wherein said first and second polysilicon layers are doped with an N-type conductive dopant having a concentration between about 1.0 E 18 to 1.0 E 21 atoms/cm$^3$.

17. The method of claim 11, wherein, said third polysilicon layer is selectively doped by photoresist masking and ion implantation to form said SRAM load transistors and electrical interconnections.

18. The method of claim 11, wherein the thickness of said third polysilicon layer is between about 400 to 1000 Angstroms.

19. The method of claim 11, wherein said openings in said second polysilicon layers provide a self-aligning etch stop mask for forming contact opening in the underlying said insulating layer to said SRAM device source/drain contact areas.

20. The method of claim 11, wherein said anisotropic and selective etch of said contact openings is carried out in a plasma etcher having an etch rate ratio of silicon oxide to polysilicon greater than about 30.0 to 1.0.

* * * * *